(12) United States Patent
Osano

(10) Patent No.: US 8,063,533 B2
(45) Date of Patent: Nov. 22, 2011

(54) ELECTRONIC DEVICE HAVING PIEZOELECTRIC PUMP WHICH MAY PREVENT OR REDUCE DETERIORATION OF S/N RATIO WHICH MAY BE CAUSED BY AIR NOISE OF THE PUMP DURING A RECORDING OPERATION

(75) Inventor: Keiji Osano, Tokyo (JP)

(73) Assignee: Sony Corporation (JP)

( * ) Notice: Subject to any disclaimer, the term of this patent is extended or adjusted under 35 U.S.C. 154(b) by 355 days.

(21) Appl. No.: 12/378,537

(22) Filed: Feb. 17, 2009

(65) Prior Publication Data

US 2009/0206699 A1 Aug. 20, 2009

(30) Foreign Application Priority Data

Feb. 18, 2008 (JP) ................. P2008-036410

(51) Int. Cl.
*H01L 41/08* (2006.01)
*G06F 19/00* (2011.01)
*F04B 17/00* (2006.01)
*H05K 7/20* (2006.01)

(52) U.S. Cl. .............. 310/311; 360/97.02; 360/97.03; 720/648; 720/649; 361/688; 361/689; 361/694; 361/695; 361/690; 361/676; 361/677; 361/678; 361/679.46; 361/679.48

(58) Field of Classification Search .......... 310/311, 310/317
See application file for complete search history.

(56) References Cited

U.S. PATENT DOCUMENTS

| 4,939,402 | A | * | 7/1990 | Hirayama et al. | ........ 310/316.01 |
| 5,641,903 | A | * | 6/1997 | Shinotuka et al. | ......... 73/204.18 |
| 7,287,965 | B2 | * | 10/2007 | Vogeley et al. | ............ 417/413.2 |
| 7,308,340 | B2 | * | 12/2007 | Matsuoka et al. | ............ 700/300 |
| 7,564,164 | B2 | * | 7/2009 | Yamamoto et al. | ........... 310/317 |
| 2004/0228091 | A1 | * | 11/2004 | Miyairi | ......................... 361/695 |
| 2008/0018200 | A1 | * | 1/2008 | Vogeley et al. | ............... 310/317 |
| 2008/0174959 | A1 | * | 7/2008 | Sano et al. | ..................... 361/695 |
| 2009/0002939 | A1 | * | 1/2009 | Baugh et al. | .................. 361/687 |

(Continued)

FOREIGN PATENT DOCUMENTS

JP 04343561 A 11/1992

(Continued)

OTHER PUBLICATIONS

Office Action from Japanese Application No. 2008-036410, dated Feb. 16, 2010.

*Primary Examiner* — Jaydi San Martin
(74) *Attorney, Agent, or Firm* — Lerner, David, Littenberg, Krumholz & Mentlik, LLP

(57) ABSTRACT

An electronic device having a piezoelectric pump. The electronic device includes: an audio input section; an audio recording section recording input sound from the audio input section; a piezoelectric pump cooling air by a piezoelectric element; a drive circuit driving the piezoelectric element; and a control circuit monitoring and controlling operation of the audio input section, the audio recording section, and the drive circuit, wherein when an operation mode being monitored is an audio recording mode, in which the input sound is used for recording by the audio recording section, the control circuit controls the drive circuit to decrease the amount of air flow exhausted outside from the piezoelectric pump, and when the operation mode being monitored is another mode without audio recording, the control circuit maintains the amount of the air flow.

4 Claims, 12 Drawing Sheets

U.S. PATENT DOCUMENTS

| | | | |
|---|---|---|---|
| 2009/0167109 A1* | 7/2009 | Tomita et al. | 310/317 |
| 2009/0243431 A1* | 10/2009 | Ohsawa | 310/317 |
| 2010/0079094 A1* | 4/2010 | Beltman et al. | 318/460 |
| 2010/0196177 A1* | 8/2010 | Hirata et al. | 417/413.2 |

FOREIGN PATENT DOCUMENTS

| | | | |
|---|---|---|---|
| JP | 2618685 B2 | | 6/1997 |
| JP | 10247123 A | | 9/1998 |
| JP | 2976489 B2 | | 11/1999 |
| JP | 3115618 B2 | | 12/2000 |
| JP | 2006297295 A | | 11/2006 |
| JP | 2007329849 A | | 12/2007 |
| JP | 2009264135 A | * | 11/2009 |

\* cited by examiner

IN THE CASE OF HIGH Na

IN THE CASE OF LOW Na

ELECTRONIC DEVICE HAVING PIEZOELECTRIC PUMP WHICH MAY PREVENT OR REDUCE DETERIORATION OF S/N RATIO WHICH MAY BE CAUSED BY AIR NOISE OF THE PUMP DURING A RECORDING OPERATION

CROSS REFERENCES TO RELATED APPLICATIONS

The present application claims priority from Japanese Patent Application No. JP 2008-036410, filed in the Japanese Patent Office on Feb. 18, 2008, the entire content of which is incorporated herein by reference.

BACKGROUND OF THE INVENTION

1. Field of the Invention

The present invention relates to an electronic device having a piezoelectric pump which lowers the internal temperature of the device by moving air through vibration of a piezoelectric element.

2. Description of the Related Art

A drive circuit of a piezoelectric element has come into practical use for a liquid spray and various kinds of actuators (for example, Japanese Patent Nos. 2618685 and 3115618).

In this drive circuit, a switching transistor is connected to a primary winding of a transformer, and a piezoelectric element is connected to a secondary winding of the transformer. The circuit generates and controls a drive voltage of the piezoelectric element by switching operation of the transistor.

Also, a drive circuit having a resonant circuit, which causes parallel resonance with a piezoelectric element in order to generate a sinusoidal drive voltage at a secondary side by performing switching with a transistor, etc., at a primary side, has come into practical use as a drive circuit of an ultrasonic motor using a piezoelectric element (for example, Japanese Patent No. 2976489).

SUMMARY OF THE INVENTION

When a main unit of an electronic device is miniaturized, heat generated from ICs, etc., is accumulated in the main unit of the device during operation when the amount of power consumption is kept high, or the like. This causes the main unit to be heated.

In electronic devices, an air-cooling fan, which generates a wind by rotating a fan using a motor, is often used as a heat discharger in order to prevent an increase in the internal temperature.

The air-cooling fan is usually disposed near an air intake of the main unit of the device, and causes a wind to blow and circulate in a space inside the main unit of the device in order to obtain cooling effect.

However, in the case of an air-cooling fan, the pressure that can be generated at the time of making a wind is low, and thus it has been necessary to keep an air-flowing path large in order to suppress air-flow resistance. Thus, the air-cooling fan is not suitable to be applied to an air cooling apparatus for a small-sized electronic device, such as a mobile device, etc.

The drive circuits of a piezoelectric element, which are described in the above-described Japanese Patent Nos. 2618685, 3115618, and 2976489, can be used for such an air pump apparatus (in the following, called a piezoelectric pump). The air pump is particularly suitable for a small-sized mobile device driven by a battery, because the air pump has a very high discharge pressure and high air-cooling efficiency, and at the same time, the air pump is small in size and low in power consumption.

On the other hand, a piezoelectric (air) pump has a high air-discharge pressure, and thus produces air noise (air flow sound) when air is discharged from the case of the device to the outside.

In an electronic device having an audio input section, such as a microphone, etc., for recording sound, a distance between the audio input section (microphone) and the air outlet decreases as the device main unit is more miniaturized. Accordingly, air noise from the piezoelectric (air) pump is picked up by the microphone. This increases the noise level, and the signal to noise ratio (S/N ratio) of recording sound is deteriorated.

In electronic devices having an audio input section for recording sound and a piezoelectric pump for cooling air, it is desirable to propose an electronic device capable of preventing or restraining deterioration of the S/N ratio, which is caused by air noise from the piezoelectric pump, at the time of sound recording.

According to an embodiment of the present invention, there is provided an electronic device having a piezoelectric pump, including: an audio input section; an audio recording section recording input sound from the audio input section; a piezoelectric pump cooling air by a piezoelectric element; a drive circuit driving the piezoelectric element; and a control circuit monitoring and controlling operation of the audio input section, the audio recording section, and the drive circuit, wherein when an operation mode being monitored is an audio recording mode, in which the input sound is used for recording by the audio recording section, the control circuit controls the drive circuit to decrease the amount of air flow exhausted outside from the piezoelectric pump, and when the operation mode being monitored is another mode without audio recording, the control circuit maintains the amount of the air flow.

The embodiment of the present invention may further include a sound detection section detecting a level of the input sound, wherein the control circuit may further include a memory storing a level of air noise produced when the piezoelectric pump outputs air outside, and the control circuit may read the level of the air noise corresponding to the amount of air flow from the memory, may detect a level of ambient noise when assumed to have no recording sound from output of the sound detection circuit, may obtain an allowable noise margin from a difference in noise levels of the detected air and the ambient air, if the obtained allowable noise margin is less than a predetermined value, the control circuit may perform control to decrease the amount of air flow, and if the allowable noise margin is not less than the predetermined value, the control circuit may maintain the amount of air flow at that time.

In the embodiment of the present invention, the drive circuit may include a transformer; and a switch circuit performing switching operation of a power source voltage at a primary side of the transformer on the basis of an input drive pulse signal, and applying a drive voltage in accordance with a duty ratio of the drive pulse signal to the piezoelectric element connected to a secondary side of the transformer, the control circuit decreases the duty ratio of the drive pulse signal controlling the switch circuit from a predetermined value if the operating mode is the audio recording mode, the control circuit maintains the duty ratio at the predetermined value if the operating mode is the other mode, and the control circuit generates the drive pulse signal and outputs the generated drive pulse signal to the switch circuit.

The embodiment of the present invention may further include a detection circuit detecting the drive voltage generated at the secondary side of the transformer, wherein the control circuit may monitor an amplitude of the drive voltage after changing the duty ratio on the basis of the output of the detection circuit, and if the amplitude of the monitored drive voltage is different from a desired value, the control circuit may be allowed to further adjust the duty ratio.

By the present invention, it is possible to prevent or reduce deterioration of an S/N ratio caused by air noise of a piezoelectric pump at the time of recording sound.

DESCRIPTION OF THE PREFERRED EMBODIMENTS

In the following, a description will be given of an embodiment of the present invention with reference to the drawings.

An electronic device according to the present embodiment uses a piezoelectric (air) pump utilizing a piezoelectric element as an air-cooling device, and at least can receive and record audio input from the outside.

The piezoelectric (air) pump is useful for a system serving as a countermeasure against an increase in the internal temperature of a mobile device and a stationary device. In particular, in the case of a mobile device, a case of the device is small in size, and thus a fan-type air cooling apparatus used so far is sometimes difficult to be disposed.

The piezoelectric pump has a feature enabling such a high air discharge pressure that is difficult for an air-cooling fan method to obtain while the pump is small in size. Thus, piezoelectric pump is particularly useful for a system serving as a countermeasure against an increase in the internal temperature of the mobile device.

An electronic device according to the present embodiment may be any type of device, such as a digital camera recording still images or moving images together with sound, a cellular phone, a (recording and) playback apparatus of music and video, the other multimedia devices, etc.

Figure 1:
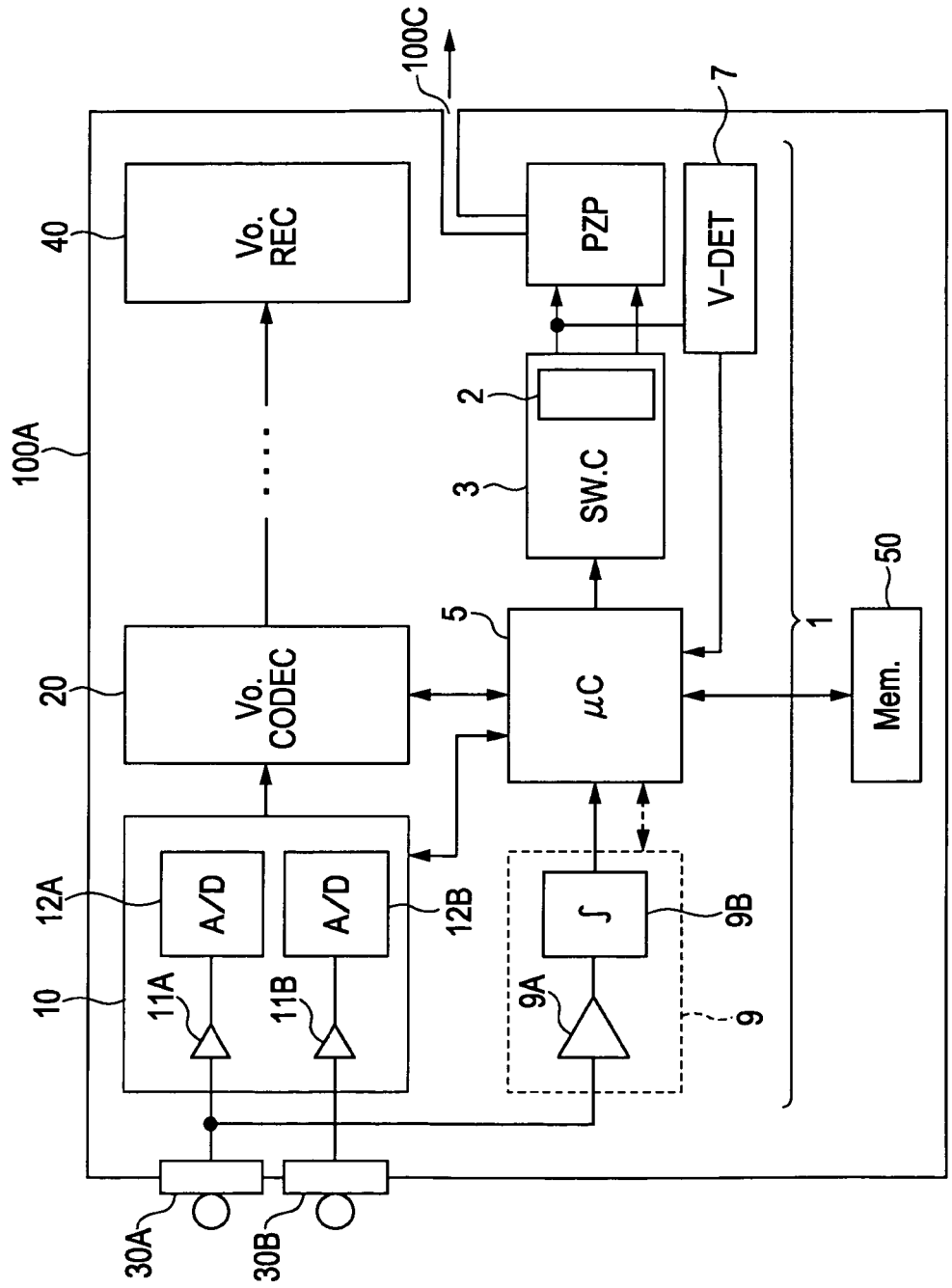
FIG. 1 is a circuit block diagram illustrating a main configuration of an electronic device according to an embodiment.

FIG. 1 illustrates a circuit block diagram of an electronic device according to the present embodiment.

The electronic device 100 illustrated in FIG. 1 schematically includes a piezoelectric pump PZP for cooling air, a drive circuit 1 thereof, an audio-input processing section 10, an audio codec section (Vo.CODEC) 20, at least one microphone as an "audio input section", a recorder (Vo.REC) 40 as an "audio recording section", and a memory 50.

In the example shown in FIG. 1, the electronic device is provided with two microphones 30A and 30B. Processing system of the audio-input processing section 10 is divided into two systems corresponding to the two microphones.

The audio-input processing section 10 has an amplifier 11A performing variable amplification of sound from the microphone 30A, an A/D converter 12A converting the amplified sound from the amplifier 11A into digital audio data, an amplifier 11B performing variable amplification of sound from the microphone 30B, and an A/D converter 12B converting the amplified sound from the amplifier 11B into digital audio data.

The recorder 40 includes a mechanism and a circuit for recording the audio data coded by the audio codec section 20 onto a recording medium (a hard disk, a magneto-optical disc, a semiconductor memory, etc.), which is not shown in the figure.

A description will be given of functions of the memory 50 later.

The drive circuit 1 has an electromagnetic coupling transformer 2, a switch circuit (SW.C) 3, a microcomputer (μC) 5 as a "control circuit", a detection circuit (V-DET) 7 for detecting the output of the electromagnetic coupling transformer 2, and an audio detection circuit 9 for detecting a sound level from the microphone 30A.

The audio detection circuit 9 includes an amplifier 9A and an integrator 9B integrating the output of the amplifier 9A for each constant period.

Figure 2:
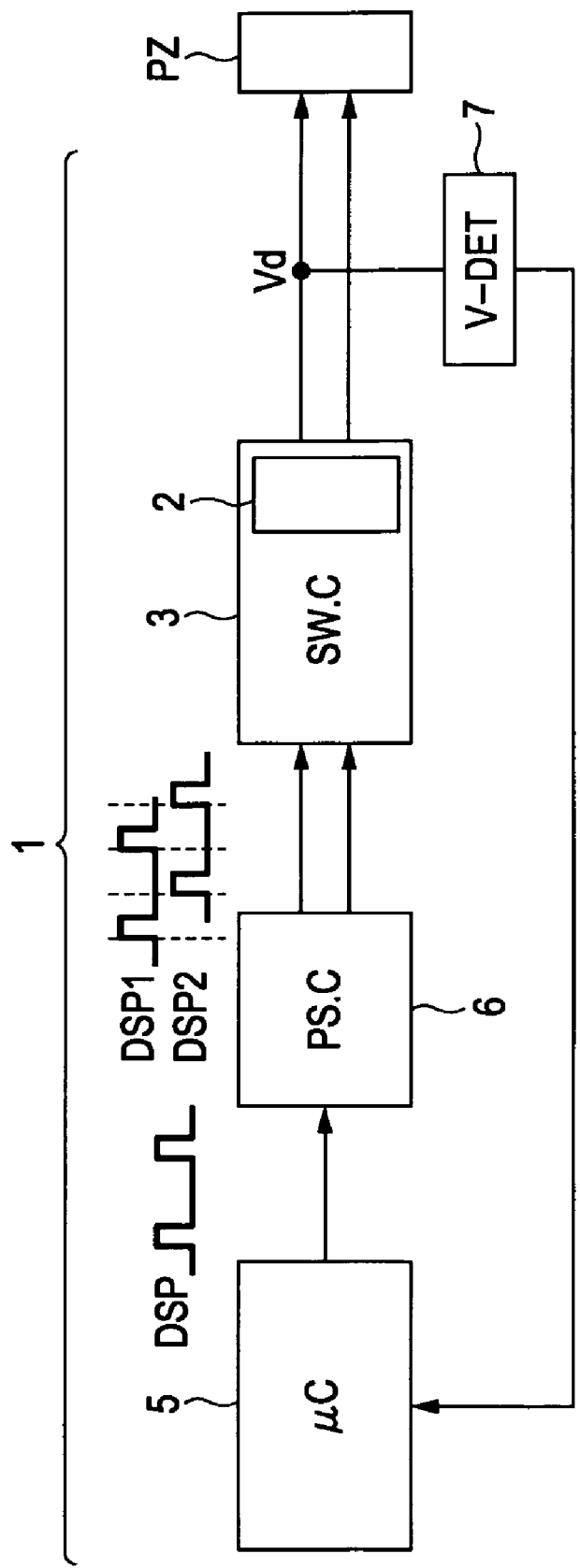
FIG. 2 is a circuit block diagram illustrating a configuration of a drive circuit according to an embodiment.

FIG. 2 is a circuit block diagram illustrating a main part of the drive circuit 1 when a phase shift circuit 6 is further added. Also, FIG. 3 is a circuit diagram illustrating an example of a more detailed configuration of the electromagnetic coupling transformer 2, the switch circuit 3, and the detection circuit 7.

In the following, a description will be given of each component of the drive circuit 1 with reference to FIGS. 1 to 3.

Figure 3:
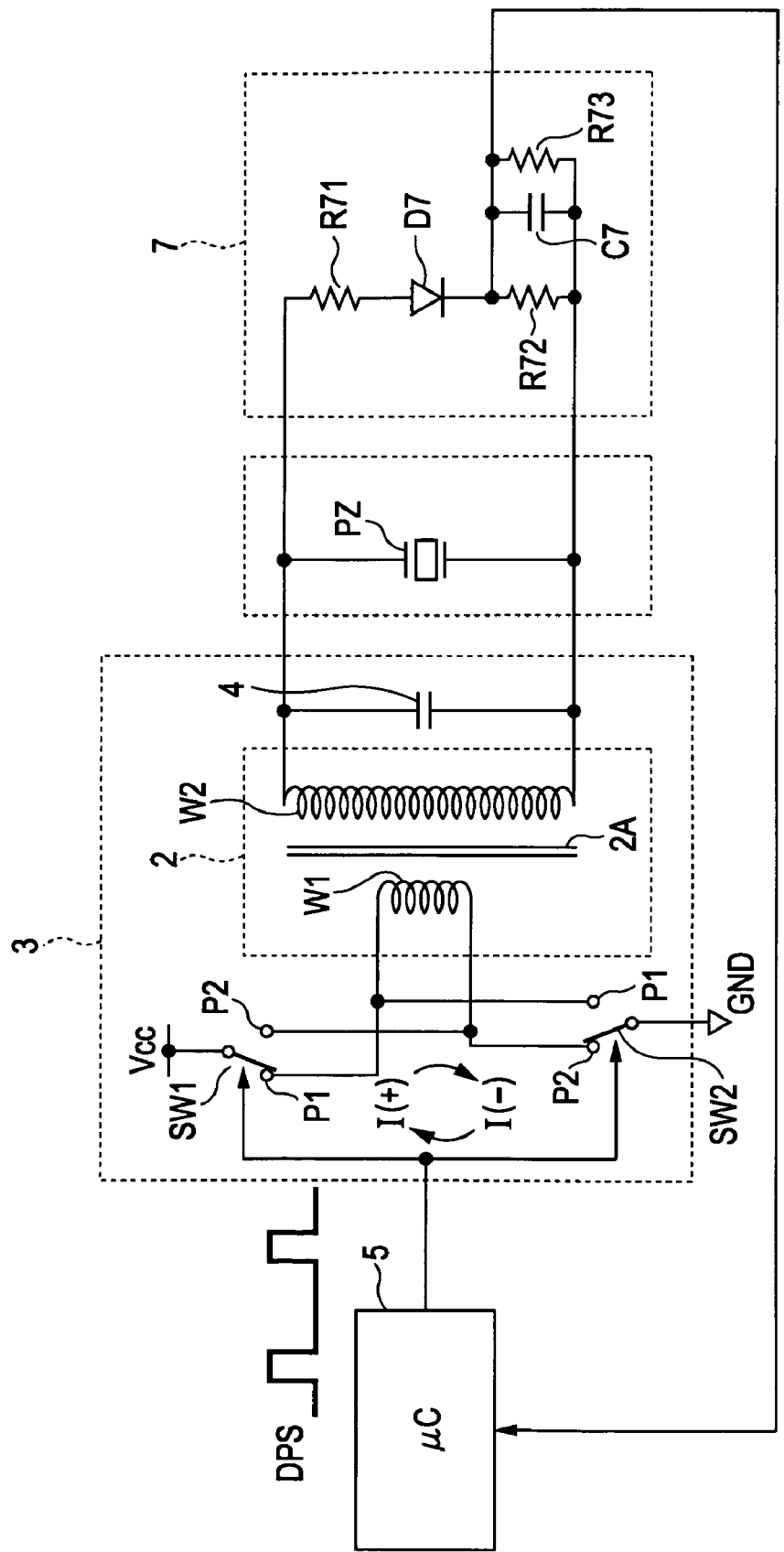
FIG. 3 is a circuit diagram illustrating an example of a more detailed configuration of a switch circuit and a detection circuit according to an embodiment.

As shown in FIG. 3, the electromagnetic coupling transformer 2 has a primary winding W1, a secondary winding W2, and a magnetic material 2A disposed between the two windings and having a relative permeability of 1 or more. The primary winding W1 and the secondary winding W2 are electrically and magnetically coupled by the magnetic material 2A. In the electromagnetic coupling transformer 2, the ratio (turns ratio) of the turn numbers of the primary winding W1 and the secondary winding W2 is set to be a predetermined value.

The switch circuit 3 is connected to the primary winding W1 of the electromagnetic coupling transformer 2, and the piezoelectric element PZ is connected to the secondary winding W2 of the electromagnetic coupling transformer 2. The piezoelectric element PZ is a vibration device built in the piezoelectric pump PZP in FIG. 1.

FIG. 3 illustrates the exemplary switch circuit 3 having a so-called two-switch configuration.

The switch circuit 3 shown as an example has two switches SW1 and SW2, which are formed by transistors, etc., individually. The switches SW1 and SW2 are switches which change the connection of an operating piece to either of two contact points, individually. The operating piece of the switch SW1 is connected to a power-source voltage Vcc, and the operating piece of the switch SW2 is connected to a reference voltage of the power-source voltage, for example, ground voltage GND.

Each of the switches SW1 and SW2 has a first contact point P1 connected to one of terminals of the primary winding W1 and a second contact point P2 connected to the other of the terminals of the primary winding W1. The contact points are switched differentially as described below. As shown in FIG. 3, when an operating piece of the switch SW1 is connected to the first contact point P1 to be in a state in which the power-source voltage Vcc is supplied, an operating piece of the switch SW2 is connected to the second contact point P2 to be in a state in which the ground voltage GND is supplied. On the contrary, when the operating piece of the switch SW1 is changed to be connected to the second contact point P2 to be in a state in which the power-source voltage Vcc is supplied to the other of the terminals of the primary winding W1, substantially at the same time, the operating piece of the switch SW2 is connected to the first contact point P1 to be in a state in which one of the terminals of the primary winding W1 is connected to the ground voltage GND.

In order to realize such a two-contact switch with transistors, the switch circuit 3 should be provided by connecting four transistors in a so-called H-bridge configuration. The H-bridge configuration can be realized, for example, by forming the switch SW1 with two PMOS transistors performing an on-off operation differentially, and forming the switch SW2 with two NMOS transistors operating differentially.

The switches SW1 and SW2 are controlled by a drive pulse signal DPS, which is output from the microcomputer 5 and has a predetermined duty ratio.

When a drive pulse is a high level (in the following, described as "H"), the switch circuit 3 becomes a connection state as shown in FIG. 3, for example. Thus, a current flows from the switch SW1 side to the switch SW2 side in the primary winding W1 only in a short time period when the drive pulse is "H". In the following, this current is described as a "positive current I(+)". When the drive pulse become a low level (in the following, described as "L") by being turned off, both of the switches SW1 and SW2 are turned off, and the primary winding W1 becomes a high-impedance state.

When a next drive pulse is input, the switch circuit 3 becomes a connection state contrary to that shown in FIG. 3, and the current direction flowing through the primary winding W1 is reversed. A current at this time is described as a "negative current I(−)". When the drive pulse is turned off, both of the switches SW1 and SW2 are turned off, and the primary winding W1 becomes a high-impedance state.

By the above-described operation being repeated, the positive current I(+) and the negative current I(−) flow alternately during only a predetermined short period of time, individually, and intermittent current is driven with a period of no current flowing during a periods of flowing the positive current I(+) and the negative current I(−).

In this regard, when the switch circuit 3 is driven by one drive pulse signal DPS as shown in FIG. 3, a function of alternately operating the two switches SW1 and SW2 for each input pulse ought to be implemented in the switch circuit 3. However, if this function is implemented by a circuit in the switch circuit 3, the size of the switch circuit 3 becomes large, and thus this method is not too realistic.

Thus, in the present embodiment, a phase shift circuit 6 is disposed as shown in FIG. 2.

The phase shift circuit 6 receives input of the drive pulse signal DPS from the microcomputer 5, directly outputs the signal as a first drive pulse signal DPS1, and also shifts the phase of the drive pulse signal DPS by 180 degrees to generate a second drive pulse DPS2. The first and the second drive pulse signals DPS1 and DPS2 are output from the phase shift circuit 6 to the switch circuit 3 in parallel.

The switch circuit 3 controls the positive current I(+) drive based on the switches SW1 and SW2 by the first drive pulse signal DPS1, and controls the negative current I(−) based on the switches SW1 and SW2 by the second drive pulse DPS2. Thereby, the switch circuit 3 can be formed by a simple circuit. Thus, in the same manner as described above, the primary winding W1 can be current-driven alternately by the positive current I(+) and the negative current I(−), and intermittently.

The function of the phase shift circuit 6 may be possessed by the microcomputer 5. Also, as described above, the function of alternately operating the two switches SW1 and SW2 for each input pulse may be implemented by a circuit in the switch circuit 3. Further, the drive pulse signal DPS shown in FIG. 3 may be changed to a ternary pulse in which a positive pulse and a negative pulse appear alternately and intermittently with a middle level, such as the ground voltage GND as center, for example, and the switch circuit 3 may be driven by this pulse.

In any of these cases, the phase shift circuit 6 becomes unnecessary, and thus the phase shift circuit 6 is not an indispensable component.

The detection circuit 7 is a circuit detecting the drive voltage of the piezoelectric element PZ, which appears on the secondary winding W2 of the electromagnetic coupling transformer 2.

The detection circuit may be configured in any suitable form. For example, the detection circuit 7 can be implemented by a simple half-wave rectification circuit as shown in FIG. 3, for example.

The detection circuit 7 shown in FIG. 3 includes three resistors R71 to R73, a diode D7, and a capacitor C7.

A series circuit of the resistor R71, the diode D7, and the resistor R72 is connected to the secondary winding W2 and the piezoelectric element PZ in parallel. The capacitor C7 and the resistor R73 are connected to the resistor R72 in parallel. An output (detection voltage Vdet) is obtained from the cathode of the diode D7.

When an anode potential of the diode D7 is higher than a cathode potential by some degree, a current flows through the diode D7 in the forward direction, and thus the capacitor C7 is charged while this current flows, which results in the output of a detection voltage Vdet. When the potential difference between the anode and the cathode changes so as to decrease, a very slow discharge takes place through the large resistor R73. Thereby, the waveform of the detection voltage Vdet is smoothed (becomes substantially constant). This smoothing is continued when the potential difference between the anode and the cathode becomes small so that no current flows through the diode D7, and further during the period when the potential difference between the anode and the cathode is reversed so that the diode D7 is reverse-biased. Next, when the anode potential becomes higher than the cathode potential by some degree again, the capacitor C7 starts to be charged again. However, the charging of the second time and after is for making up for a slight potential drop by the discharge during the time of smoothing immediately before.

After that, smoothing and a slight charge for making up for a potential drop during the smoothing time are repeated in the same manner. Thus, a voltage having a waveform close to a substantially constant direct current is obtained as the detection voltage Vdet. The value of the detection voltage Vdet (direct-current voltage level) is directly proportional to the amplitude of the drive voltage appearing at the secondary winding W2.

The detection voltage Vdet obtained in this manner is input into the microcomputer 5, and the detected potential is read by an internal A/D converter as a digital value.

The microcomputer 5 has a function of controlling the drive voltage Vd output from the electromagnetic coupling transformer 2 by controlling the duty ratio of the drive pulse signal DPS.

Also, the microcomputer 5 monitors and controls all the components shown in FIG. 1. The microcomputer 5 monitors and controls (instructs) "audio recording mode" in which the recorder 40, as the "audio recording section" shown in FIG. 1, records sound from the microphone 30A (and 30B), as the "audio input section" onto a recording medium not shown in the figure, and the other modes. The other modes are all the modes without audio recording, and include, for example, "recording-only-image mode", "playback mode" of audio and video, "data transfer mode" of audio and video data to the other external and internal recording medium, "data input mode" of inputting audio and video data from the outside, the other "setting, etc., mode", and the like.

When an operation mode is the "audio recording mode", the microcomputer 5 has a function of decreasing the amount of air flow of the piezoelectric pump PZP shown in FIG. 1 lower than a usual predetermined value. A description will be given of this function later. The amount of air flow is controlled through the control of the drive voltage Vd.

In the following, first, a detailed description will be given of the drive voltage control for power saving drive, and then a description will be given of the control to reduce air flow on the basis of this control.

A function of controlling the drive voltage Vd serves to control the amount of air flow of the piezoelectric pump PZP shown in FIG. 1.

Regarding this function, when the microcomputer 5 increases (or decreases) a driving force of the piezoelectric element PZ in accordance with a mode, for example, the microcomputer 5 changes the duty ratio of the drive pulse signal DPS by a predetermined amount. At this time, since the detection circuit 7 is provided, the microcomputer 5 can confirm that the result of the change in the duty ratio of the drive pulse signal DPS is correctly reflected on the drive voltage Vd appearing on the secondary winding W2 of the electromagnetic coupling transformer 2. The microcomputer 5 obtains information on whether the change in the duty ratio has been insufficient or excessive as a result of the confirmation, and thus the microcomputer 5 can fine adjust the duty ratio of the drive pulse signal DPS in order to obtain a desired drive voltage Vd on the basis of the obtained information.

Next, a description will be given of a configuration for changing a resonant frequency, which is necessary for power-saving drive.

The switch circuit 3 controlled by the drive pulse signal DPS operates so as to repeat setting on the primary winding W1 of an on-state in which a current flows through the primary winding W1 of the electromagnetic coupling transformer 2 or an off-state in which a current does not flow on the primary winding W1 at a predetermined frequency specified by the input drive pulse signal DPS. At this time, for example, the on-state corresponds to a high level ("H") of the drive pulse, and the off-state corresponds to a low level ("L").

Here, a frequency (cycle T) of a primary current drive of the electromagnetic coupling transformer 2 is defined as a current drive frequency. The current drive frequency is desirably set to match the resonant frequency of the resonant circuit formed at the secondary side of the electromagnetic coupling transformer 2 and including the piezoelectric element PZ. Here, the operation is possible even if the current drive frequency does not completely match the resonant frequency. However, it is desirable that the current drive frequency and the resonant frequency match in order to produce the voltage waveform of the piezoelectric element PZ as a sinusoidal wave.

For this purpose, as shown in FIG. 3, in the circuit configuration, a reactive element 4 is connected in parallel to the secondary winding W2 of the electromagnetic coupling transformer 2.

When the primary current drive of the electromagnetic coupling transformer 2 is intermittently performed by repeating the above-described on-state and off-state, the power consumption at the primary side of the switch circuit 3 is relatively small, because the power consumption is a time-average of the power consumption by a short-pulse current having a short duration time.

When a pulse current is once applied to the primary side of the electromagnetic coupling transformer 2, an alternating voltage (drive voltage Vd) is applied to the piezoelectric element PZ by the resonance of the secondary-side of the resonant circuit, and if the circuit is remained in an off state, the alternating voltage is gradually attenuated. This attenuation occurs because of energy loss, such as the copper loss of the resonant circuit (winding circuit). In the present embodiment, energy replenishment is preferably performed by the next pulse current from the primary side only for a short time period before pulse height values are diminished at positive and negative sides of the alternating voltage given to the piezoelectric element PZ at the secondary side of the electromagnetic coupling transformer 2, and this operation is repeated periodically. However, energy replenishment may be performed periodically only during a short time period after the alternating voltage applied to the piezoelectric element PZ is diminished to a certain degree.

In the present embodiment, there is no electrical discharge path from the resonant circuit to the outside (for example the GND line), and thus electrical discharge to the outside does not occur substantially. As described above, the energy loss, such as copper loss, etc., of the resonant circuit is replenished with intermittent current drive from the primary side. The energy loss is all replenished from the primary side at minimum.

Thus, it is possible to perform very efficient operation at low power consumption.

The equivalent capacitance value of the piezoelectric element PZ is determined depending on the purpose of the element. Thus, it is sometimes difficult for the microcomputer 5 to make the current-drive frequency equal to or substantially equal to the resonant frequency of the resonant circuit only by changing the frequency (current-drive frequency) of the drive pulse signal DPS generated by the microcomputer 5.

Accordingly, a reactive element 4 is added to the resonant circuit in order to make the current-drive frequency equal to or substantially equal to the resonant frequency of each resonant circuit. The reactive element 4 forms a parallel-resonant circuit resonating at the (current) drive frequency together with the capacitance component of the equivalent circuit of the piezoelectric element PZ and the inductance component of the electromagnetic coupling transformer 2.

The addition of the reactive element 4 to the resonant circuit is implemented by connecting a capacitor in parallel with the piezoelectric element PZ as shown in FIG. 3. Alternatively, an inductor may be connected to the piezoelectric element PZ in parallel or in series.

Figure 4:
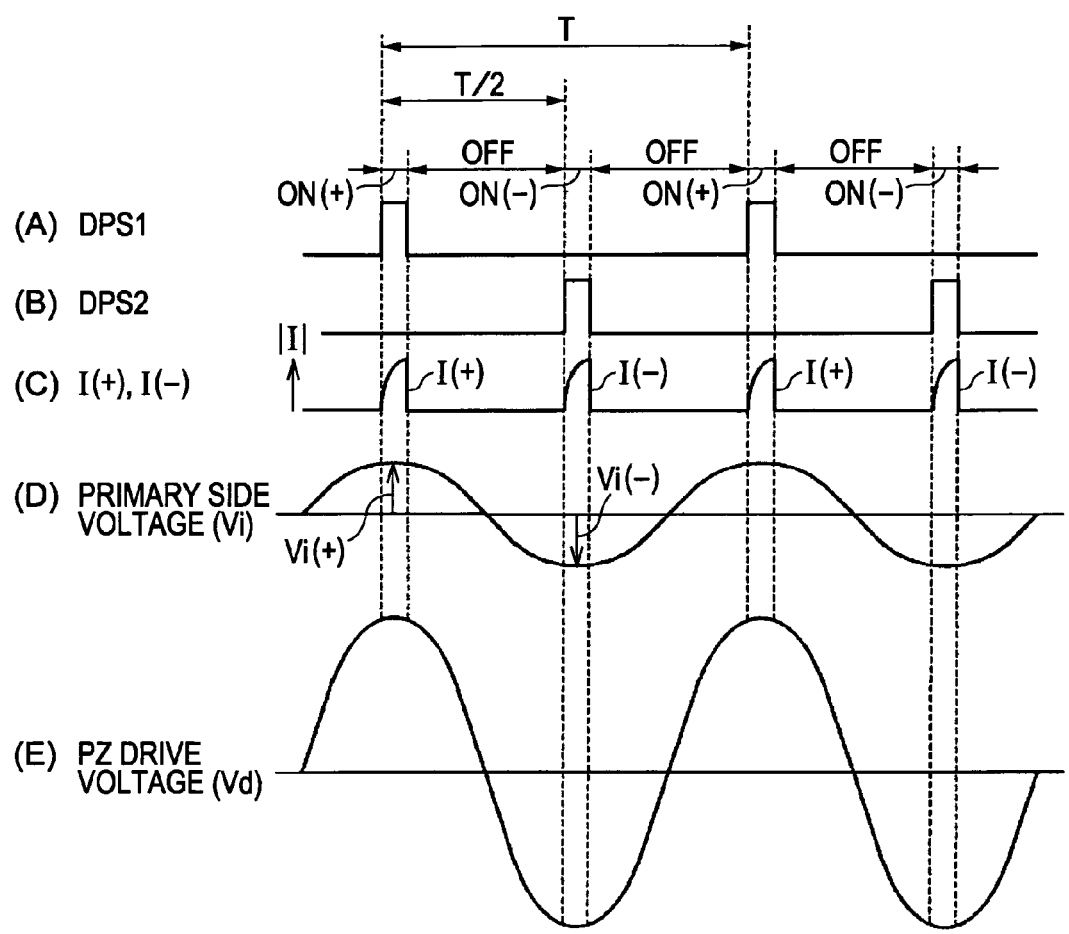
FIG. 4 is an operation waveform chart of the circuit shown in FIG. 3.

Next, referring to FIGS. 4 to 5, a description will be given of an operation of the drive circuit 1, which is configured as described above.

FIGS. 4(A) to 4(E) are operation waveform charts of the circuit shown in FIG. 3. FIG. 5 is an equivalent circuit diagram of the piezoelectric element PZ.

Figure 5:
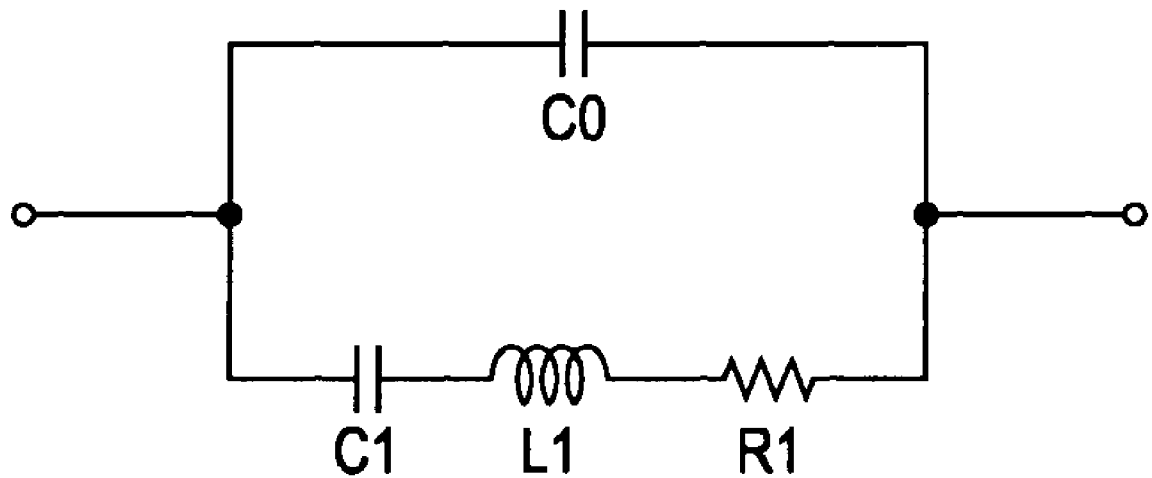
FIG. 5 is an equivalent circuit diagram of a piezoelectric element.

As shown in FIG. 5, the piezoelectric element PZ can be represented as an equivalent circuit diagram having a series circuit including a capacitor C1, an inductor L1, and a resistor R1, and a capacitor C0, which is connected to the series circuit in parallel.

At this time, the resonant frequency of the resonant circuit is determined by the combined capacitance of an equivalent capacitance component (mainly C1) of the piezoelectric element PZ and the capacitance C (FIG. 3) as the reactive element 4, and the combined inductance of the equivalent inductance element (L1) of the piezoelectric element PZ and the secondary winding coil W2.

In the switch circuit 3, when the second drive pulse DPS2 output from the phase shift circuit 6 shown in FIG. 2 is "L", and the first drive pulse signal DPS1 becomes "H", as shown in FIG. 3, the switch SW1 is connected to the power-source voltage Vcc, and the switch SW2 is connected to the ground voltage GND. Thus, the positive current I(+) flows through the primary winding W1.

Also, when the first drive pulse signal DPS1 is "L", and the second drive pulse DPS2 becomes "H", the negative current I(−) having the opposite direction flows through the primary winding W1.

As shown in FIG. 4(A), the period of time that the first drive pulse signal DPS1 is "H" is specified by a pulse that continues for a short time period (displayed by ON(+)), which is shorter than a constant half cycle T/2. This pulse is repeated on the constant cycle T.

As shown in FIG. 4(B), the period of time that the second drive pulse signal DPS2 is "H" is specified by a short duration (displayed by ON(−)) of the pulse, which has the same cycle T and a 180-degree phase difference with the pulse of the first drive pulse signal DPS1. The duration of the two pulses (so called pulse widths) may be different, but is assumed to be the same here.

In the following, the pulse duration of the first drive pulse signal DPS1 is called "a positive-current-drive time or an ON(+) time", and the pulse duration of the second drive pulse signal DPS2 is called "a negative-current-drive time or an ON(−) time".

There are periods of a constant off-state in which a current does not flow through the primary winding W1 during a period between an ON(+) time and the next ON(−) time and during a period between the ON(−) time and the next ON(+) time.

In the off-state, both of the switches SW1 and SW2 in FIG. 3 are off, and thus the switch circuit 3 becomes a high-impedance state as viewed from both ends of the primary winding W1. Accordingly, only a current as little as an off-leak of the transistor flows during the off state, and thus the power consumption substantially equals to zero.

FIG. 4(C) is a waveform chart showing the values (absolute values: |I|) of the positive current I(+) and the negative current I(−).

The current is started to flow when a pulse is turned on, and then is saturated. In the example in FIG. 4(C), the ON(+) time and the ON(−) time are determined such that the pulse is turned off at the saturation point in time. Also, in an unsaturated region, the current value decreases, and thus input power decreases. On the other hand, after the saturation, there is no operational meaning even if the pulse width is extended more than that, only resulting in an increase of power consumption. Thus, it is desirable to set the ON(+) time and the ON(−) time in the vicinity of the current saturation time at the maximum, individually.

The voltage across both ends of the primary winding W1 is defined, with respect to the end to which connection to ground voltage GND in FIG. 3 is controlled, as a voltage (primary voltage Vi) of the end to which connection of the power-source voltage Vcc is controlled. The waveform thereof is shown in FIG. 4(D).

Assuming that on-resistance of a transistor can be disregarded, both of the primary voltage Vi(+) at the ON(+) time and the primary voltage Vi(−) at the ON(−) time become substantially the magnitude of the power-source voltage Vcc (for example, about 5 [V]). The voltage of this intermittent short time period is set to the primary winding W1 forcibly by the primary-side performance. On the other hand, during the off-period between that time, the primary-side forcible voltage power is released from the primary winding W1. However, a voltage which is dependent on the resonant frequency of the resonant circuit also appears on the primary side by the influence of the secondary side.

The ratio of the wave height values of the primary voltage Vi and the secondary voltage (drive voltage Vd) is determined by the turns ratio the electromagnetic coupling transformer 2.

As described above, in this operation, when the current drive frequency (the frequency of repetition operation of setting Vi(+) and Vi(−) to the primary voltage) substantially matches the resonant frequency of the resonant circuit formed, as shown in FIG. 4(D), the waveform of the primary voltage Vi substantially becomes a sinusoidal wave. Accordingly, the driving of the piezoelectric element becomes smooth and efficient, which is desirable.

If the frequencies do not match completely, a discontinuous point arises in the waveform of the primary voltage Vi at the time of intermittent setting the primary voltage. However, the operating frequency itself is determined by the current drive frequency at the primary side, and thus the driving of the piezoelectric element at a constant frequency itself is possible. However, in this case, the diving loses smoothness, and the efficiency becomes deteriorated.

Figure 6A:
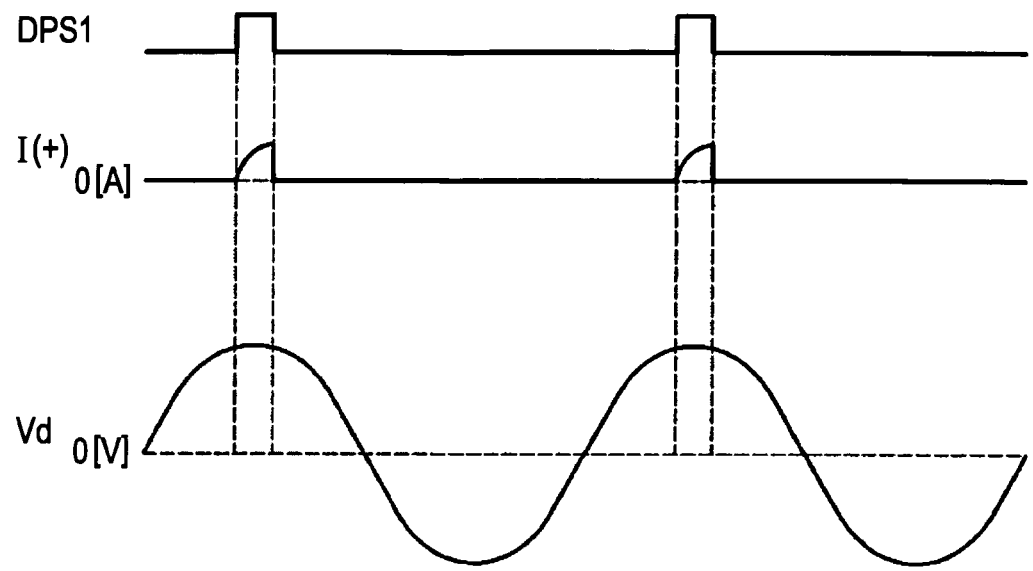
FIG. 6 is an operation waveform chart, of when a drive duty ratio is changed, according to the embodiment.
Figure 6B:
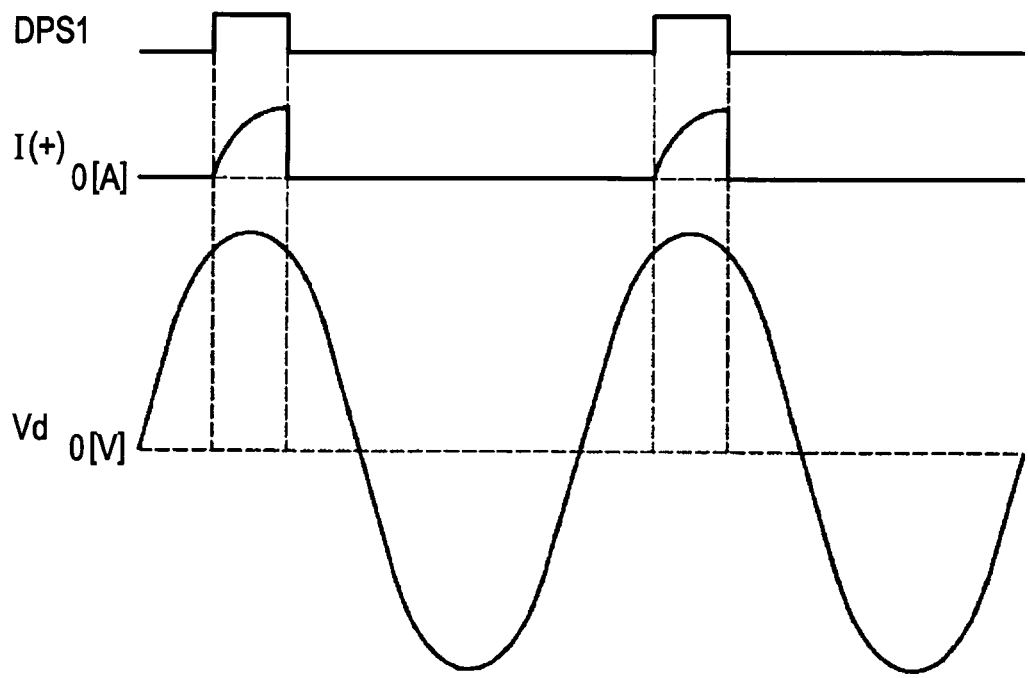

FIGS. 6A and 6B are waveform charts when the microcomputer 5 changes the duty ratio of the drive pulse signal DPS. In FIGS. 6A and 6B, individual waveforms of the first drive pulse signal DPS1, the positive current I(+), and the drive voltage Vd only are shown for the sake of convenience.

It is understood that when the duty ratio (ON(+)/T) is increased from a small value in FIG. 6A to a large value in FIG. 6B, the wave height value of the drive voltage Vd is increased as much as the increase in the duty ratio.

For example, the drive voltage Vd is changed by controlling such a duty ratio, and the amount of air flow of the piezoelectric pump PZP shown in FIG. 1 is changed in accordance with the change of the drive voltage Vd.

The amount of air flow of the piezoelectric pump PZP is also changed by changing the frequency of the piezoelectric drive. However, the frequency control is not performed in order to directly control the amount of air flow, but is performed in order to increase the efficiency of the piezoelectric drive. That is to say, frequency control is secondarily performed in order to ensure a desired amount of air flow at lower power consumption.

Next, a brief description will be given of the frequency control.

Figure 7:
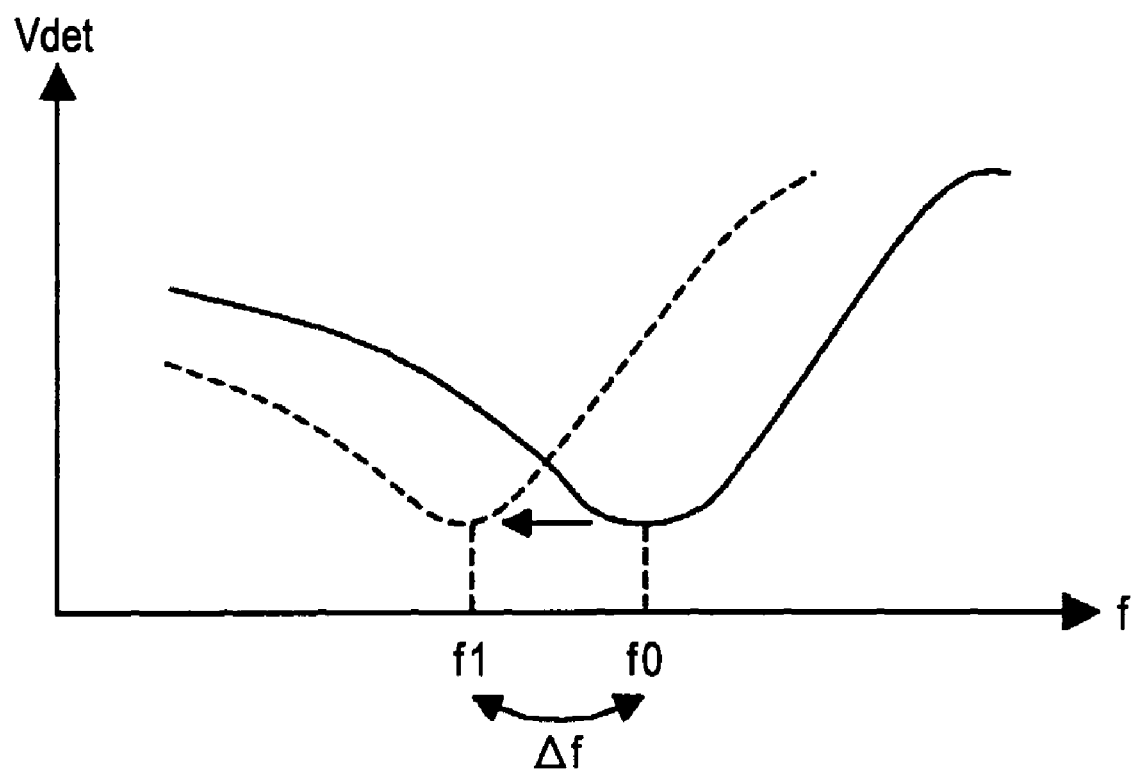
FIG. 7 is a graph of frequency dependency of detection voltage according to the embodiment.

FIG. 7 illustrates an influence by an increase in temperature. FIG. 7 is a graph of frequency dependency of the detection voltage Vdet, which is output from the detection circuit 7.

At a steady-state temperature, for example at room temperature (25 degrees), in general, a time-average amplitude of the output voltage (drive voltage Vd) of the electromagnetic coupling transformer 2, which is monitored by the detection voltage Vdet, increases as the frequency f of the output drive pulse signal DPS by the microcomputer 5 increases, and thus a greater drive force is given to the piezoelectric element PZ. However, in a frequency region having a lower frequency than a certain from f0, the average amplitude of the drive voltage Vd (detection voltage Vdet) decreases as the frequency f increases. This is because in the secondary resonant circuit of the electromagnetic coupling transformer 2 including the reactance element 4 the capacitance component becomes more dominant than the inductance component.

Accordingly, as shown in FIG. 7, the curve of the frequency dependency of the detection voltage Vdet has a minimum value at the frequency f0. The frequency f0 corresponds to the resonant frequency of the resonant circuit, and thus the drive circuit 1 performs the most efficient power saving drive at the frequency f0.

However, a phenomenon of shifting the minimum point (a high-efficient point) of the detection voltage Vdet to a lower frequency side as a curve shown by a broken line in FIG. 7 is observed with increasing temperature.

On the basis of a temperature detection signal St received from a temperature detection circuit 8, the microcomputer 5 changes the cycle of the drive pulse signal DPS so as to change the current drive frequency by the amount of frequency shift as much as the temperature change. At this time, the duty ratio may be further adjusted in order to obtain a desired drive voltage Vd in accordance with the change in the current drive frequency.

In the example in FIG. 7, it is assumed that the frequency f0 having a minimum detection voltage Vdet is changed to a lower frequency f1 by an increase in temperature.

The microcomputer 5 performs control for increasing the cycle T of the drive pulse signal DPS in order to decrease the current drive frequency by the amount of frequency change Δf (=f0−f1).

In the case of a decrease in temperature, the opposite operation to the above is performed.

In this control, it is necessary to store a relationship between the temperature and the amount of control (the amount of frequency change Δf or the cycle T to be controlled, etc.) into, for example, the memory 50 (refer to FIG. 1) or a table held by the microcomputer 5 itself. The microcomputer 5 obtains the amount of control from the detected temperature by referring to the table, and changes the current drive frequency using the obtained amount of control.

By performing the drive frequency control in this manner, even if there is a change in temperature, the drive circuit 1 continuously maintains to perform the most efficient power-saving drive on the piezoelectric element PZ.

Thus, it is possible to control the amount of air flow of the piezoelectric pump PZP by power-saving drive.

Regarding necessity for a change in the amount of air flow, if an ambient temperature increases during operation, the amount of air flow is changed in order to increase air-cooling ability by increasing the amount of air flow. Thus, a detection element detecting the ambient temperature may be disposed in the electronic device 100. Also, it is possible to control to increase the amount of air flow as time goes on after the power is turned on. Further, the control may be performed such that the amount of air flow may be increased in the "recording mode", the "playback mode", the "data transfer mode", "data input mode", etc., in which processing load of various processing circuits is assumed to be large, and the amount of air flow may be decreased in the "setting mode".

All the control of the amount of air flow is performed with an increase in temperature. However, in the present embodiment, the amount of air flow is performed to decrease from a different viewpoint with no respect for or in addition to the control of the amount of air flow with the increase in temperature.

The different viewpoint is a viewpoint of ensuring the S/N ratio at audio recording time. More specifically, it is a viewpoint of preventing or restraining deterioration of the S/N ratio at recording time, which is caused by noise from the sound (air flow sound) at the time of discharging air from the piezoelectric pump PZP.

Figure 8:
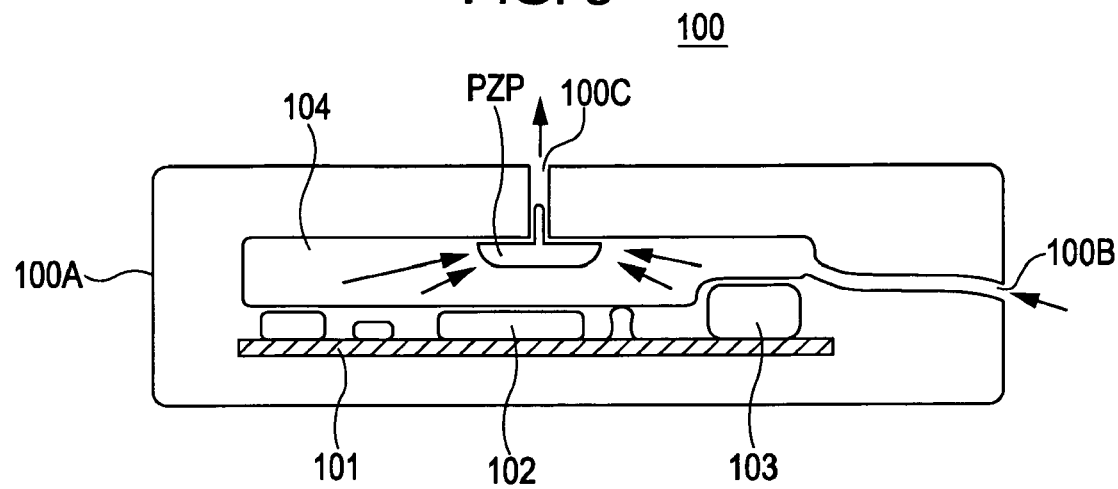
FIG. 8 is a diagram illustrating a structure of an electronic device and disposition of a piezoelectric pump according to the embodiment.

FIG. 8 schematically illustrates the disposition of a piezoelectric pump in an electronic device.

An electronic device 100 illustrated in FIG. 8 includes a circuit substrate (may be plural) 101 in the case 100A thereof. A large number of ICs, the other circuit 102, a power-source control part 103, etc., are mounted on the circuit substrate 101 at a high density. Thereby, the drive circuit 1 shown in FIG. 1, the audio input section 10, the audio codec section 20, the recorder 40, the memory 50, etc., are disposed.

The electronic device 100 has a heat collecting section 104 forming a space shielded to a certain degree, and having a position, a size, a shape, and a material which are suitable for efficiently collecting radiated heat from all the heat generating parts, such as a circuit part 102, a power-source control part 103, etc.

The heat collecting section 104 is formed by a material having a high heat conductivity, and has fins (not shown in the figure) for collecting heat to be contacted or be close to the heat radiation section of each part. The air in the space of the heat collecting section 104 is heated by the collected heat through the fins and an external wall of the heat collecting section 104.

The external surface of the case 100A is provided with an air intake opening 100B and an air outlet opening 100C, which communicate with the space in the heat collecting section 104.

Figure 9:
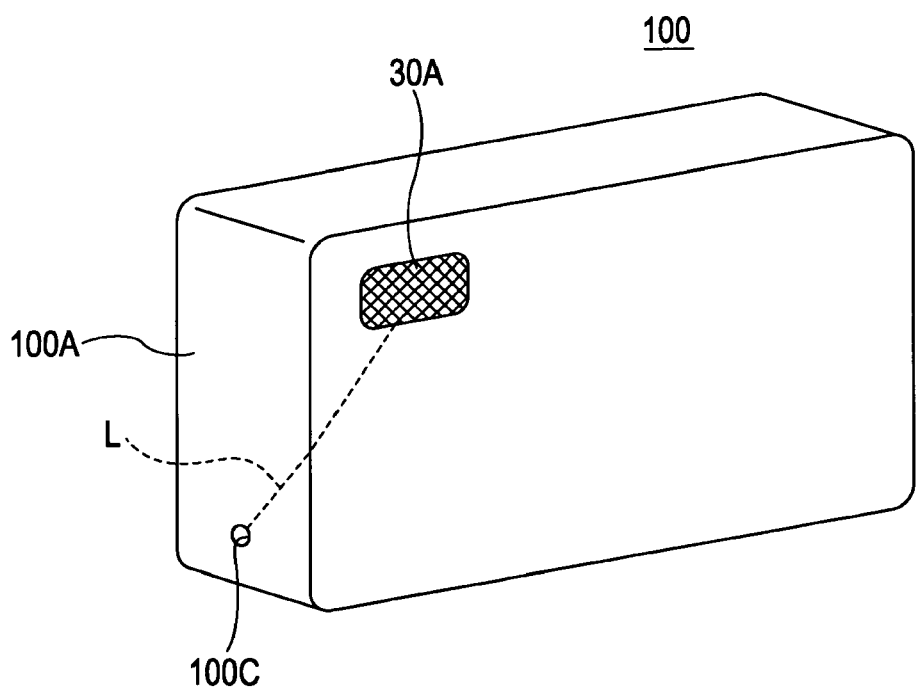
FIG. 9 is a simplified outer view of an electronic device according to an embodiment of the present invention.

FIG. 9 is a perspective view illustrating an example of disposition of the air outlet opening 100C and the microphone 30A.

The diameters of the air outlet opening 100C and the air intake opening 100B shown in FIGS. 8 and 9 may be relatively small, for example a few millimeters. It is desirable that the air intake opening 100B and the air outlet opening 100C are positioned at a slightly recessed part or at a root of a projection in order not to be occupied by a palm of a human hand or a finger.

However, in a small-sized electronic device, as shown in FIG. 9, it is sometimes difficult to have a sufficiently long distance (shortest distance on the surface of the case) L between the air outlet opening 100C and the microphone 30A collecting input sound. In this case, the level of the air noise described above of the input sound from the microphone 30A becomes large.

Referring back to FIG. 8, the piezoelectric pump PZP as a "pump apparatus" is fixed at a position enabling air to be absorbed from the ambient space to be efficiently discharged through the air outlet opening 100C in the heat collecting section 104.

The piezoelectric pump PZP includes the piezoelectric element PZ shown in FIGS. 2 and 3, and is connected to the drive circuit 1. The drive circuit 1 is mounted on the circuit substrate 101.

The piezoelectric pump PZP serves as a function of air-movement drive source which causes wind to blow in the heat collecting section 104 and forcibly discharges the heat from the heat generating bodies, such as an IC, etc., on the basis of the structure of such an electronic device 100 and the disposition of the pump in the structure.

Figure 10:
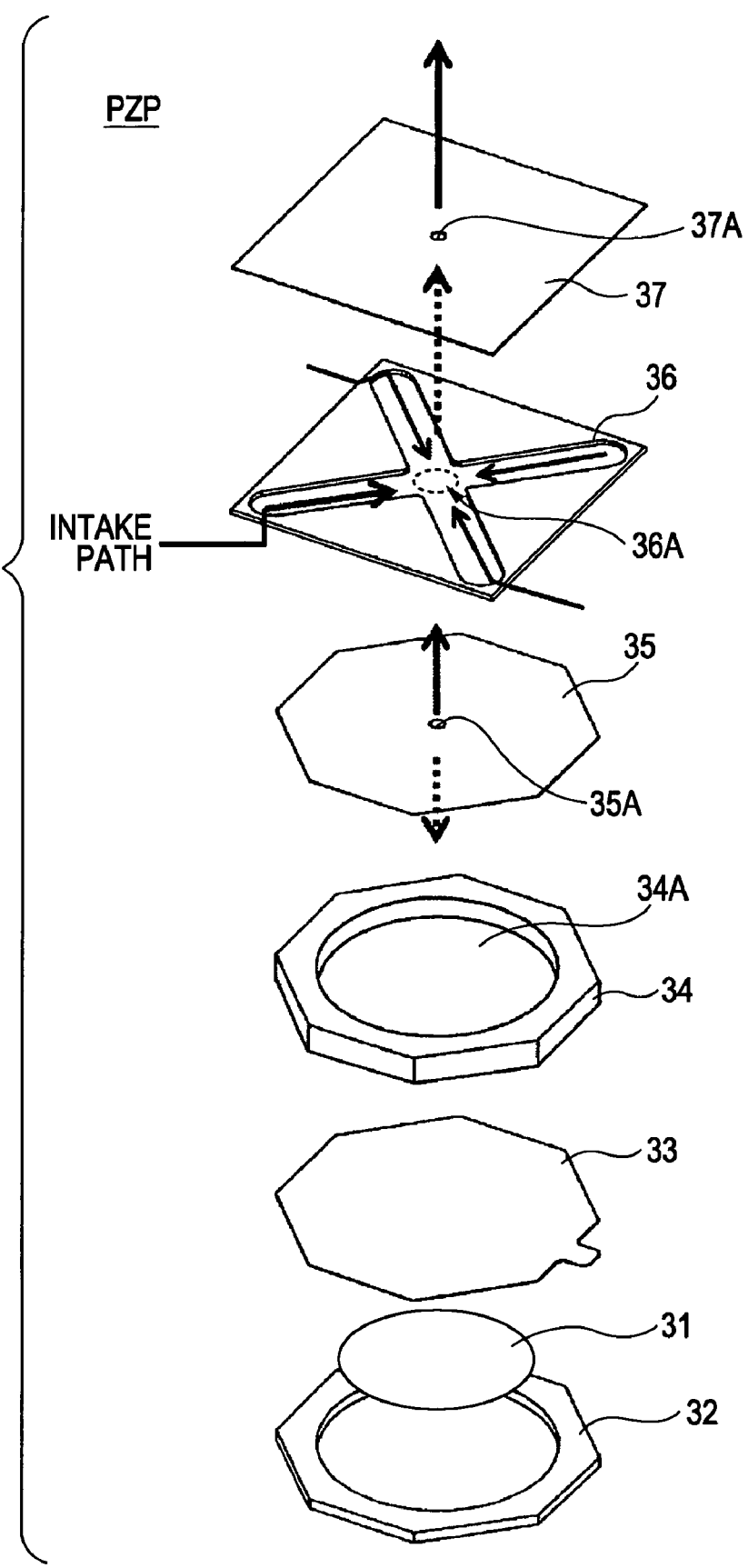
FIG. 10 is an assembly diagram of a piezoelectric pump to be used as an air-cooling apparatus according to the embodiment.

FIG. 10 is an assembly diagram of the piezoelectric pump PZP.

The illustrated piezoelectric pump PZP has a piezoelectric body unit 31 as a "piezoelectric element PZ", a protection ring 32, a diaphragm 33, a first spacer 34, an intermediate plate 35, a second spacer 36, and a top plate 37.

The protection ring 32 is made of a corrosion-resistant material having high rigidity, such as a stainless steel, for example, and is formed in the shape of a ring in order to ensure an internal space. The piezoelectric body unit 31 is contained in the protection ring 32, and a non-vibrating part of the piezoelectric body unit 31 is fixed to the protection ring 32. The first spacer 34 is placed on the protection ring 32 with sandwiching the diaphragm 33 therebetween.

The first spacer 34 is made of a corrosion-resistant material having high rigidity, such as a stainless steel, for example, and is formed in the shape of a ring so that the internal space serves as a pump chamber 34A.

The diaphragm 33 is a kind of vibrating members vibrating in accordance with the vibration of the piezoelectric body of the piezoelectric body unit 31. A thin and deformable material having a high strength is used for the diaphragm 33. Also, the diaphragm 33 serves to increase airtightness of the contact surface with first spacer 34.

The intermediate plate 35 having a small communicating opening 35A at the center is placed and fixed on the top surface of the first spacer 34 so as to increase airtightness of the contact surfaces of both of the members. Thus, the pump chamber 34A communicates to the outside only through the communicating opening 35A. Accordingly, when the piezoelectric body of the piezoelectric body unit 31 vibrates to move the diaphragm 33 up and down, the internal volume of the pump chamber 34A repeats expansion and contraction. Thus, air goes in and out through the communicating opening 35A at a high speed.

Further, the second spacer 36 and the top plate 37, which are made of a corrosion-resistant material having high rigidity, such as a stainless steel, for example, are fixed to the intermediate plate 35 so as to increase airtightness of the contact surfaces one another.

The second spacer 36 is provided with internal space (four paths) formed in order to ensure air intake paths from four directions, for example. The ends of the four paths are substantially closed, but individually have a small intake opening. Also, the top plate 37 has an air discharge opening 37A at the center. Thereby, a venturi nozzle section 36A communicating the air discharge opening 37A with the communicating opening 35A is formed in the central part of the second spacer 36.

Figure 11A:
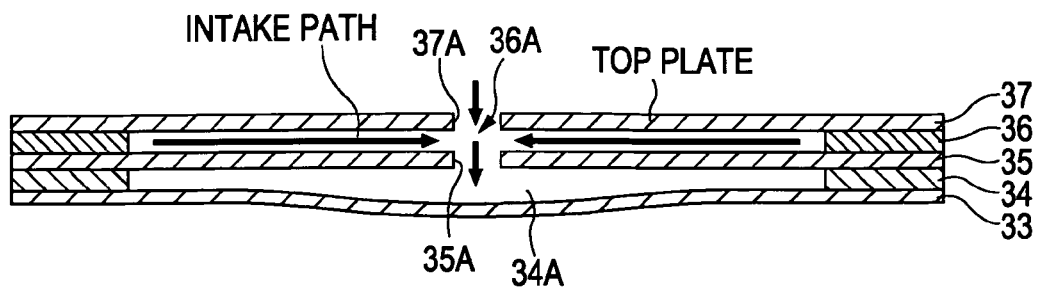
FIGS. 11A, 11B, and 11C are sectional views and a perspective view illustrating air paths of the piezoelectric pump according to the embodiment, respectively.
Figure 11B:
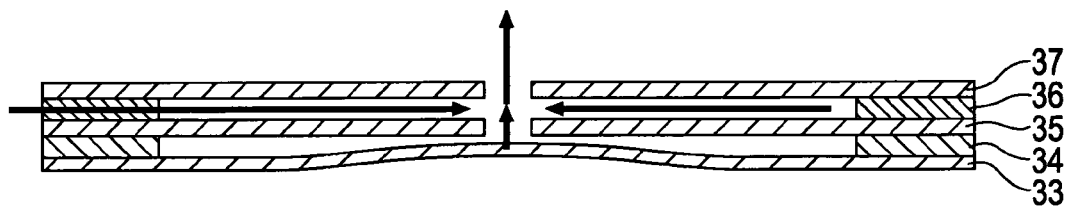

FIGS. 11A, 11B are schematic sectional views illustrating air paths of the piezoelectric pump PZP. FIG. 11A illustrates air paths at intake time, and FIG. 11B illustrates air paths at discharge time.

When the piezoelectric body unit 31 slowly moves the diaphragm 33 up and down, the volume of the pump chamber 34A becomes large by intake, and thus air comes in through the paths shown in FIG. 11A. Also, the volume of the pump chamber 34A becomes small by discharge, and thus the internal air is exhausted with great force from the air discharge opening 37A through the communicating opening 35A and the venturi nozzle section 36A as shown in FIG. 11B.

Repetition of the intake and the discharge at a high speed (a frequency of 20 [kHz] or more) results in an exhaust operation of continuous air flow from the air discharge opening 37A at a constant pressure. At this high-speed drive, the air discharge opening 37A does not serve as an intake opening as FIG. 11A, but almost exclusively functions as an air discharge opening. Thus, air intake takes place through the space of the intake paths in the four directions, which is formed in the second spacer 36 shown in FIG. 10 and small holes (intake openings) at the tops thereof.

Figure 11C:
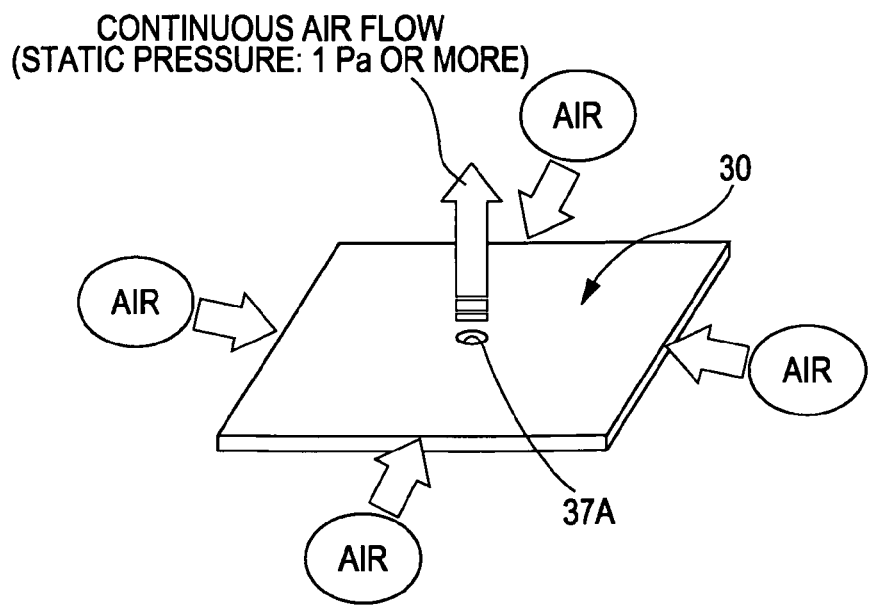

FIG. 11C is a schematic view illustrating the piezoelectric pump PZP suitable for an air-cooling apparatus and air-flow paths at operation time.

The piezoelectric pump PZP can be used as a small air-cooling apparatus having a top view length of about 20 [mm] and a thickness of about 1 [mm]. In the case where an above-described drive circuit shown in FIG. 3 is used and the circuit is driven by 20 [$V_{p-p}$] and 20 [kHz], a continuous airflow having a static pressure of 1 to a few [Pa] is obtained, which is exhausted from the discharge opening 37A.

The piezoelectric pump PZP, which has the above-described structure and performs the operation, is connected to the drive circuit 1 as shown in FIG. 1, and is driven by the drive circuit 1.

At this time, as described using FIG. 6, it is possible to control the amount of air flow (the amount of air movement per time) exhausted from the piezoelectric pump PZP by changing the amplitude of the drive voltage Vd in accordance with the duty ratio of the drive pulse signal DPS.

The amount of air flow from the piezoelectric pump PZP is based on the piezoelectric vibrating element (piezoelectric body unit 31). Accordingly, if a large drive voltage Vd is input into the piezoelectric pump PZP, the piezoelectric vibrating plate in the piezoelectric pump PZP vibrates in a large swing, and thus it is possible to ensure a large amount of air flow and back pressure, whereas the power consumption becomes large.

Also, if a small drive voltage Vd is input into the piezoelectric pump PZP, the amplitude of the piezoelectric vibrating plate in the piezoelectric pump PZP decreases, and thus the amount of air flow and back pressure decrease. However, there is a certain amount of back pressure enabling a sufficient air flow in air channels, which are thin wind paths, and thus it becomes possible to serve heat dissipation at a certain level while keeping the power consumption low.

Figure 12:
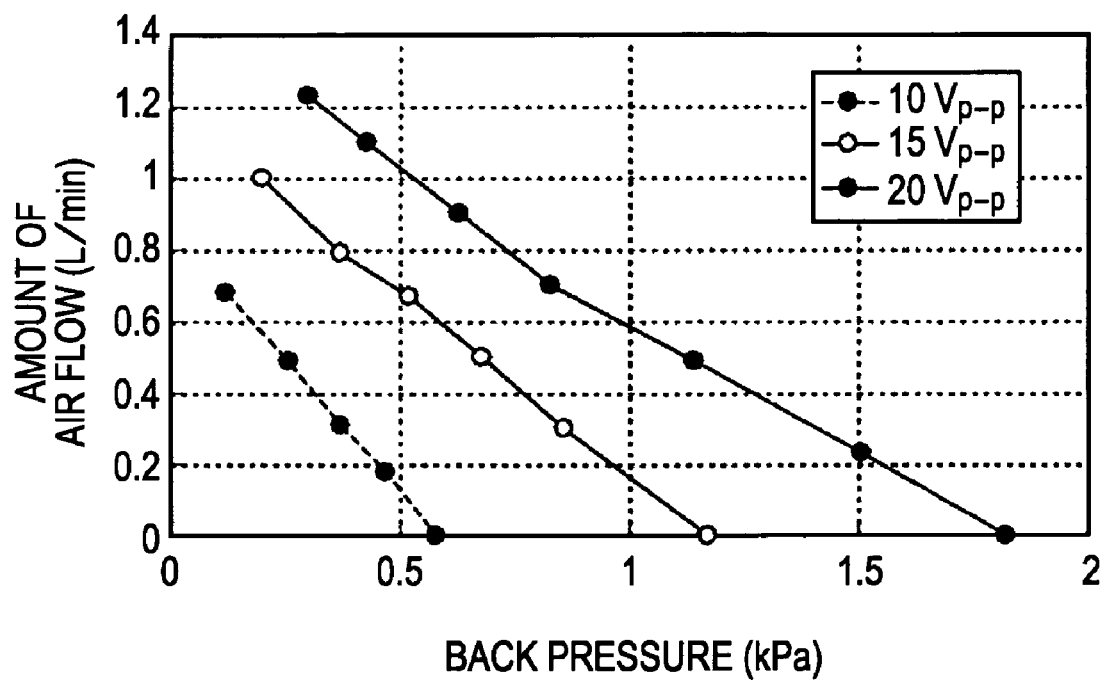
FIG. 12 is a graph showing back-pressure dependency on the amount of air flow discharged from the piezoelectric pump according to the embodiment using a maximum amplitude of a drive voltage as a parameter.

FIG. 12 shows back-pressure dependency on the amount of air flow discharged from the piezoelectric pump using a maximum amplitude of the drive voltage Vd as a parameter.

Here, "back pressure" corresponds to an internal pressure of the heat collecting section 104 in FIG. 8.

By referring to FIG. 12, it is understood that when the back pressure is large, no matter how high the drive voltage Vd is raised, a desired amount of air flow (the amount of air flow from the piezoelectric pump PZP) is not obtained. This is because the amount of air supplied from the outside is too much, and thus the piezoelectric drive efficiency decreases.

Also, the amount of air flow can be increased as the amplitude of the drive voltage Vd increases. In particular, if the drive voltage Vd is 20 [$V_{p-p}$], and the back pressure is about 0.5 [kPa] or less, the amount of air flow becomes 1 [L/min] or more, which is so large that can not be obtained by a fan method.

In the structure shown in FIG. 8, the diameter of the air intake opening 100B is relatively small, and thus the back pressure can be kept relatively small. Accordingly, it is possible to have high air-cooling efficiency.

In this regard, even if the air intake opening 100B and the air outlet opening 100C are not provided in particular, and air is input and output through gaps of the case of the device, as far as air tightness of the heat collecting section 104 is maintained to a certain degree, the back pressure can be kept small. However, it is necessary for the heat collecting section 104 to have an air outlet opening and an air intake opening.

In an application to an air-cooling system, it is desirable to drive a piezoelectric pump by a two-phase signal having phases, which are shifted 180 degrees with each other, as the first and the second pulse signals DPS1 and DPS2 shown in FIG. 2.

The same effect can be obtained by single-phase-signal drive using the drive pulse signal DPS from the microcomputer 5. However, in the case of the single-phase-signal drive, a loss, such as a winding wire loss of the electromagnetic coupling transformer 2 occurs in a cycle time depending on a drive frequency. Accordingly, the drive level is sometimes deteriorated.

In such a case, it is desirable to apply a method of driving by a two-phase signal having 180-degree shifted phases with each other in order to prevent a loss, and to keep the dive waveforms under a constant level.

In the case of a reactance load, such as a piezoelectric vibration element, if the drive frequency is set such that the capacitive reactance and the inductive reactance included therein cancel with each other in order to realize low power drive, the impedance becomes only a pure resistance component. Thus, maximum efficiency at the amount of work of the reactance load is obtained.

In that sense, it is desirable to drive at the resonant frequency of the resonant circuit. Accordingly, in the case where the drive frequency is difficult to be controlled at the resonant frequency, it is effective to dispose the reactive element 4 as shown in FIG. 3. Also, it is desirable to match the current drive frequency at the primary side of the electromagnetic coupling transformer 2 with the resonant frequency of the resonant circuit at the secondary side.

In particular, if a use state of the set is different depending on the environment, the load of the piezoelectric pump PZP changes continually. Thus, if the drive frequency is fixed, the resonant frequency varies, and not only active power but also reactive power occurs. Accordingly, the efficiency of generating wind by the piezoelectric vibration element drops, and the piezoelectric pump PZP itself generates heat.

The variations of the frequency characteristic (refer to FIG. 7) due to the ambient temperature plays an important role as an environmental variation factor. It is effective to compensate the variations and to control to have an optimum operation frequency constantly with highest efficiency.

In the case of air cooling using such a piezoelectric pump, in order to prevent or reduce the influence of air noise on recording sound, in the present embodiment, the duty ratio of the drive pulse signal DPS (or the first and the second pulse signals DPS1 and DPS2) is decreased such that the amount of air flow is decreased lower than a usual control value only in the "audio recording mode" monitored by the microcomputer 5.

Thereby, it is possible to obtain an advantage that the S/N ratio at audio recording time is improved.

However, it is not desirable in terms of air cooling to decrease the amount of air flow without variation.

Thus, it is more desirable to perform the adaptive control described below in order to balance air-cooling efficiency and the S/N ratio.

In this desirable control, the microcomputer 5 obtains a permissible noise margin K. The "permissible noise margin" is a parameter indicating how high the level of the air noise of the wind sound that is emitted from the piezoelectric pump PZP is permitted amid the ambient noises. The permissible noise margin K can be detected from an input sound IV from the microphone 30A assuming that the audio signal level S of the sound to be recorded is zero (S=0).

Specifically, the audio detection circuit 9 shown in FIG. 1 obtains the amount of integration of the input sound IV for each predetermined time period by the integrator 9B. If the input value of the amount of the integration, that is to say, the input sound level obtained by the microcomputer 5 after the A/D conversion is denoted by the same symbol "IV", the input sound level IV can be represented by the integration value (or time-average value) of the audio signal level S, the ambient noise level Na, and the air noise level Np generated by the piezoelectric pump PZP.

Here, the air noise level Np is measured in advance in a silent room without the ambient noise and the sound to be recorded, a relationship with the amount of air flow of the piezoelectric pump PZP is obtained, and the measurement data (a relationship between the amount of air flow and Np) is stored in the memory 50 shown in FIG. 1 in advance.

Assuming that S=0, the permissible noise margin K is defined such that "Na≧Np+K" holds.

Here, there are cases where the sound signal level S at the actual use time is zero or is regarded substantially zero. For example, in the case of recording a voice of a certain person, if there is a point in time of stopping the voice during a speech, such as between words, clauses, sentences, etc., it is regarded that S=0 at that point in time. The measurement of the input sound level IV at S=0 like this can be regarded as the lowest level when the input sound level IV obtained by the audio detection circuit 9 at predetermined time intervals is found to be a lowest, and also appeared a plurality of times.

Alternatively, there is a case that S=0 does not appear in continuous recording, such as music, etc. However, the lowest level can be found by detecting for a long time period, and this lowest level can be substantially regarded as S=0.

In the other case where the sound to be recorded is a large sound continuing for a long time, it is not necessary to consider the influence of the air noise on the piezoelectric pump PZP, and thus the control is stopped.

By subtracting the air noise level Np corresponding to the current amount of air flow from the input sound level IV at S=0, which has been obtained by the microcomputer 5 through the audio detection circuit 9, it is possible to approximately estimate the ambient noise level Na.

The microcomputer 5 checks whether the difference between the ambient noise level Na, estimated in this manner, and the predetermined air noise level Np is not less than the predetermined permissible noise margin K.

As a result, if the difference between the ambient noise level Na and the air noise level Np is not less than the permissible noise margin K, the microcomputer 5 determines that it is not necessary to reduce the amount of air flow. If the difference is less than the permissible noise margin K, the microcomputer 5 determines that it is necessary to reduce the amount of air flow.

Then, the microcomputer 5 controls the drive circuit 1 in accordance with the determination result to lower the amount of air flow of the piezoelectric pump PZP by a predetermined step. After that, the microcomputer 5 compares the estimation of the ambient noise level Na and the air noise level Np once again. If the difference between the two becomes the permissible noise margin K or more, the microcomputer 5 stops the control. If the difference is less than the permissible noise margin K, the microcomputer 5 repeats the same control several times until the noise level difference not less than the permissible noise margin K is obtained.

Figure 13A:
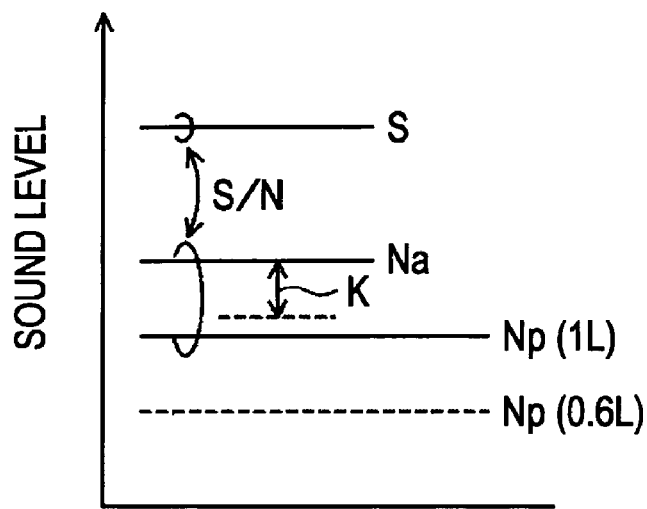
FIGS. 13A and 13B are diagrams illustrating specific examples of control, by schematically displaying levels, according to an embodiment of the present invention.
Figure 13B:
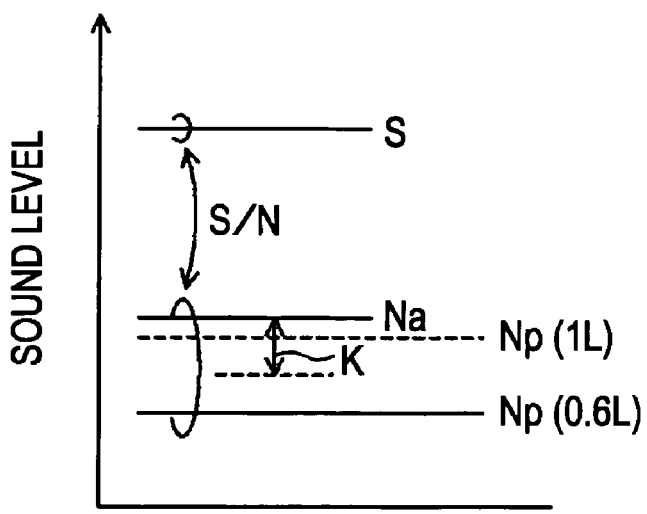

FIGS. 13A and 13B illustrate specific examples of control by schematic level display. FIG. 13A shows the case where the ambient noise level Na is relatively high, and FIG. 13B shows the case where the audio signal level S is the same as that in FIG. 13A, but the ambient noise level Na is lower than that in FIG. 13A.

In FIGS. 13A and 13B, the air noise level in the case where the amount of air flow from the air outlet opening 100C of the piezoelectric pump PZP is 1.0 [L/min] is denoted by "Np(1 L)", and the air noise level in the case where the amount of air flow is 0.6 [L/min] is denoted by "Np(0.6 L)".

In the case of FIG. 13A, the ambient noise level Na is high, and thus that level is higher than "Np(1 L)+K". Accordingly, even if the amount of air flow is 1.0 [L/min], the ratio of the air noise to the input sound level IV is low, and thus it is determined that there is no substantial inconvenience for recording sound.

In contrast, in the case of FIG. 13B, if the amount of air flow is 1.0 [L/min], "Np(1 L)+K" exceeds the ambient noise level Na. Thus, the air noise is relatively high, and thus it is necessary to reduce the amount of air flow. If the amount of air flow is decreased from 1.0 [L/min] to 0.6 [L/min], "Np(1 L)+K" becomes less than the ambient noise level Na, and thus the air noise level Np becomes low. Accordingly, it goes into a state having no substantial inconvenience for recording sound.

By performing the above-described control, it becomes possible to record sound as high quality as possible while reducing the air-cooling efficiency only at a minimum amount.

Next, descriptions will be given of variations which are capable of optionally incorporating in an embodiment.
Variation 1

If the electronic device 100 includes a function of separating sound to be recorded and noise (including air noise), it is possible to detect the noise level at S=0 using that function. For example, if the electronic device 100 is provided with a noise reduction function, it is possible to separate sound and noise using the audio data before and after the noise reduction.
Variation 2

The reactive element 4 shown in FIG. 3 can be connected in parallel to the primary winding W1 of the electromagnetic coupling transformer 2.

Whether the reactive element 4 should be connected to the primary side or to the secondary side of the electromagnetic coupling transformer 2 is determined depending on withstanding voltage specification of the reactive element 4 and the reactance value thereof.

The configuration of the switch circuit 3 is not limited to the H-bridge configuration, which includes two two-contact switches implemented by four transistors, and may be a configuration by one transistor (and a backflow prevention diode). In this case, two-phase signal drive is not possible, and thus the efficiency is low. However, the switch circuit 3 can be advantageously simplified.
Variation 3

Changing the frequency may be carried out by stopping the drive pulse periodically on a predetermined regular basis. The stop control can be performed by the microcomputer 5, or can be implemented by adding a stop control circuit to the drive circuit 1 shown in FIG. 1, etc., separately.

During a switching operation period in the switch circuit 3, if the input of the drive pulse to the switch circuit 3 is stopped for any period of time, the operation, which compensates the energy loss, such as copper loss, etc., of the resonant circuit (winding circuit) by the intermittent current drive from the primary side of the electromagnetic coupling transformer 2, is stopped. Thus, the longer the stop period, the lower the input power becomes. Accordingly, the vibration energy of the piezoelectric element PZ also decreases. That is to say, in the stop control, stopping for any period of time allows adjusting the operation (vibration energy or average vibration amplitude) of the piezoelectric element PZ.

A temperature detection circuit (not shown in the figure) may be added to the configuration in FIG. 1. The microcomputer 5, etc., may determine a cycle T of the drive pulse of the drive pulse signal DPS to change to be in multiples of the cycle T, such as 2T, 3T, . . . , in accordance with the temperature detection signal from the temperature detection circuit.

During the period without a pulse input, the drive voltage Vd changes at the resonant frequency of the resonant circuit, but the amplitude gradually decreases. The amplitude of the drive voltage Vd is recovered by the next pulse input. The amplitude of the drive voltage Vd comes to have a waveform repeating decrease and recovery. However, there may be no influence on the driving of the piezoelectric element or the influence may be slight.

In the variation 3, in the power supply to the piezoelectric element PZ in a short cyclic time period, the frequency of the power supply is decreased by stopping the drive pulse periodically and in accordance with the state of the object to be cooled. As a result, it becomes possible to reduce the time-average input power to a necessary amount.
Variation 4

A variation 4 is related to the miniaturization of the piezoelectric element.

When an H-bridge configuration is employed for the switch circuit 3 shown in FIG. 3, the bridge connection is formed by the combination of two PMOS transistors and two NMOS transistors. Such a circuit is not necessarily implemented by mounting discrete electronic parts on a circuit substrate, but can be formed in some type of an IC.

The current flowing through the primary winding W1 of the electromagnetic coupling transformer 2 is of the same order of magnitude as tens of milliamperes, and thus it is not necessary to increase the diameter of the winding wire of the electromagnetic coupling transformer 2. Also, the magnetic flux density in the core is not high, and thus it is possible to reduce the cross-sectional area of the core.

There are sheet coils in use in recent years. The sheet coils are formed by plating or vapor depositing a coil on a film. It is possible to form a small-sized multi-winding transformer by laminating these coils. Thus, a small-sized multi-winding transformer can be implemented.

Thereby, it is possible to realize a drive circuit of a piezoelectric element, which is suitable for a mobile device and is small in size with low power consumption.

By the above-described embodiment and variations, the following advantage are obtained.

It is possible to eliminate or reduce influence of the wind sound generated by driving the piezoelectric pump PZP on recording by controlling to reduce the amount of air flow of the piezoelectric pump PZP only at "audio recording mode".

In particular, by performing the control to compare the obtained ambient noise level Na and the air noise level Np, it is possible to estimate a necessary amount of air-flow reduction. Thus, it is possible to reduce the amount of air flow to the extent that there is substantially no influence on recording. Accordingly, it becomes possible to perform high-quality recording without deteriorating the air-cooling efficiency too much.

As another advantage, it is possible to efficiently drive a piezoelectric pump at saved power, because the drive frequency can be varied.

Application of a piezoelectric pump to air cooling has advantages of contributing the miniaturization of an electronic device 100 with high cooling effect. In particular, by the combination with the internal structure of the device enabling the back pressure to be kept low, the cooling efficiency can be maximized.

Further, by using the microcomputer 5 as a "control circuit", it is possible to drive a piezoelectric element only by the switch circuit 3 to be controlled.

A description will be given of this point as follows.

For example, in the liquid sucking apparatuses described in Japanese Patent Nos. 2618685 and 3115618, proposals have been made for a circuit in which power is amplified using a transformer to shape a waveform to produce a sinusoidal wave, and the phases of the voltage and current are compared and controlled in order to increase the drive efficiency of the piezoelectric vibrating element.

In the case of a reactance load, such as a piezoelectric vibration element, if the drive frequency is set such that the capacitive reactance and the inductive reactance included therein cancel with each other, the impedance becomes only a pure resistance component. Thus, maximum efficiency at the amount of work of the reactance load is obtained. This frequency is the resonant frequency.

The phase difference between the drive voltage and the drive current sometimes varies if the temperature changes. Thus, it is thought that the piezoelectric element can be most suitably driven even if there is a change in temperature.

However, in a circuit comparing the above-described phases, a hardware, namely, a circuit to realize a system is complicated. For example, it is necessary for the system to obtain phases of the voltage and of the current, and the system should be provided with a phase comparator in order to increase the efficiency of driving the piezoelectric vibration element. Also, in order to vary the amount of work of the piezoelectric vibration element, the system becomes further complicated. This is because the system should be provided with a circuit for controlling the input signal of the drive switch circuit on the basis of the control signal from the phase comparator.

In contrast, in the present embodiment, the circuit configuration is simple and allows simpler control by using the switch circuit 3 of the piezoelectric element with a transformer and the microcomputer 5. For a method of controlling the piezoelectric element PZ and the piezoelectric pump PZP, a temperature detection element (not shown in the figure) is disposed in the device, and the microcomputer 5 is used to allow flexible control of the amount of air flow by the information from the temperature detection element. The switch circuit 3 is configured by a simple switch circuit, and the microcomputer 5 performs the control of the duty ratio of the drive voltage Vd in accordance with the detected temperature, thus preventing the complication of the circuit.

In the configuration shown in FIG. 8, there is a possibility that the air intake opening 100B is occupied by a hand, and thus the back pressure becomes high to result in the deterioration of the amount of air flow or the cooling efficiency. However, even in such a case, it is possible to change the amplitude of the drive voltage Vd in order to obtain a desired amount of air flow by swiftly controlling the duty ratio on the basis of a simple control. If the air intake opening 100B is not disposed, it is possible to reduce the risk that the air intake opening 100B is occupied by a hand to increase the back pressure. Also, it is not necessary to have a large air channel on the outer case in order to dispose an air path, etc., and thus the outer view of the device can be kept cool. In this point, the present embodiment has a greater advantage over a fan-type cooling apparatus, which necessitates a large air channel.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic device having a piezoelectric pump, comprising:
    an audio input section;
    an audio recording section recording input sound from the audio input section;
    a piezoelectric pump cooling air by a piezoelectric element;
    a drive circuit driving the piezoelectric element; and
    a control circuit monitoring and controlling operation of the audio input section, the audio recording section, and the drive circuit,
    wherein the control circuit obtains a permissible noise margin indicative of a maximum level of air noise emitted from the piezoelectric pump which is permitted amid ambient noise, and
    wherein, during an audio recording mode in which the input sound is being recorded by the audio recording section, the control circuit utilizes the permissible noise margin in determining whether to decrease the amount of air flow or to maintain the amount of air flow.

2. An electronic device having a piezoelectric pump, comprising:
    an audio input section;
    an audio recording section recording input sound from the audio input section;
    a piezoelectric pump cooling air by a piezoelectric element;
    a drive circuit driving the piezoelectric element; and
    a control circuit monitoring and controlling operation of the audio input section, the audio recording section, and the drive circuit,
    wherein when an operation mode being monitored is an audio recording mode, in which the input sound is used for recording by the audio recording section, the control circuit controls the drive circuit to decrease the amount of air flow exhausted outside from the piezoelectric pump, and when the operation mode being monitored is another mode without audio recording, the control circuit maintains the amount of the air flow,
    further comprising a sound detection circuit detecting a level of the input sound,
    wherein the control circuit further includes a memory storing a level of air noise produced when the piezoelectric pump outputs air outside, and
    the control circuit reads the level of the air noise corresponding to the amount of air flow from the memory, detects a level of ambient noise when assumed to have no recording sound from output of the sound detection circuit, obtains an allowable noise margin from a difference in noise levels of the detected air and the ambient air, if the obtained allowable noise margin is less than a predetermined value, the control circuit performs control to decrease the amount of air flow, and if the allowable noise margin is not less than the predetermined value, the control circuit maintains the amount of air flow at that time.

3. An electronic device having a piezoelectric pump, comprising:
   an audio input section;
   an audio recording section recording input sound from the audio input section;
   a piezoelectric pump cooling air by a piezoelectric element;
   a drive circuit driving the piezoelectric element; and
   a control circuit monitoring and controlling operation of the audio input section, the audio recording section, and the drive circuit,
   wherein when an operation mode being monitored is an audio recording mode, in which the input sound is used for recording by the audio recording section, the control circuit controls the drive circuit to decrease the amount of air flow exhausted outside from the piezoelectric pump, and when the operation mode being monitored is another mode without audio recording, the control circuit maintains the amount of the air flow, and
   wherein the drive circuit includes
   a transformer; and
   a switch circuit performing switching operation of a power source voltage at a primary side of the transformer on the basis of an input drive pulse signal, and applying a drive voltage in accordance with a duty ratio of the drive pulse signal to the piezoelectric element connected to a secondary side of the transformer, and
   wherein the control circuit decreases the duty ratio of the drive pulse signal controlling the switch circuit from a predetermined value if the operating mode is the audio recording mode, the control circuit maintains the duty ratio at the predetermined value if the operating mode is the other mode, and the control circuit generates the drive pulse signal and outputs the generated drive pulse signal to the switch circuit.

4. The electronic device having a piezoelectric pump according to claim 3, further comprising a detection circuit detecting the drive voltage generated at the secondary side of the transformer,
   wherein the control circuit monitors an amplitude of the drive voltage after changing the duty ratio on the basis of the output of the detection circuit, and if the amplitude of the monitored drive voltage is different from a desired value, the control circuit is allowed to further adjust the duty ratio.

* * * * *